ptinstant Examiner—R. Eugene Varndell, Jr.

United States Patent [19]

Fonzi

[11] 4,052,530
[45] Oct. 4, 1977

[54] CO-DEPOSITED COATING OF ALUMINUM OXIDE AND TITANIUM OXIDE AND METHOD OF MAKING SAME

[75] Inventor: Frank Fonzi, Cedar Hill, Tex.

[73] Assignee: Materials Technology Corporation, Dallas, Tex.

[21] Appl. No.: 712,481

[22] Filed: Aug. 9, 1976

[51] Int. Cl.$^2$ .................. B32B 9/04; B32B 15/04
[52] U.S. Cl. .................. 428/552; 428/336; 428/469; 428/472; 428/539; 428/565; 428/932
[58] Field of Search ............ 428/472, 539, 552, 565, 428/932, 469, 328, 329, 195, 336; 29/182.7, 182.8; 75/203, 204, 237; 148/6.35

[56] References Cited

U.S. PATENT DOCUMENTS

| 3,684,585 | 8/1972 | Stroup et al. ............ 148/6.35 X |
| 3,736,107 | 5/1973 | Hale ............ 29/182.7 |
| 3,787,229 | 1/1974 | Rudness ............ 428/472 X |
| 3,919,124 | 11/1975 | Friedel et al. ............ 428/472 X |
| 3,974,322 | 8/1976 | Drabking et al. ............ 428/472 X |

*Primary Examiner*—Thomas J. Herbert, Jr.
*Assistant Examiner*—R. Eugene Varndell, Jr.
*Attorney, Agent, or Firm*—Jack A. Kanz

[57] ABSTRACT

Disclosed is a method of forming dense protective coatings of co-deposited aluminum oxide and titanium oxide on wear surfaces. The coating is formed by simultaneously reacting an aluminum halide gas and a titanium halide gas with water vapor on a surface maintained at a temperature of about 900° C to about 1250° C. Reaction conditions are maintained to assure mixing of the titanium halide gas with the other reactants only in the reaction zone and compositions of the reactant gases are limited to produce a coating comprising alpha alumina ($Al_2O_3$) with about 2% to about 10% hexagonal alpha titanium oxide ($Ti_2O_3$) dispersed in the alumina matrix.

6 Claims, 1 Drawing Figure

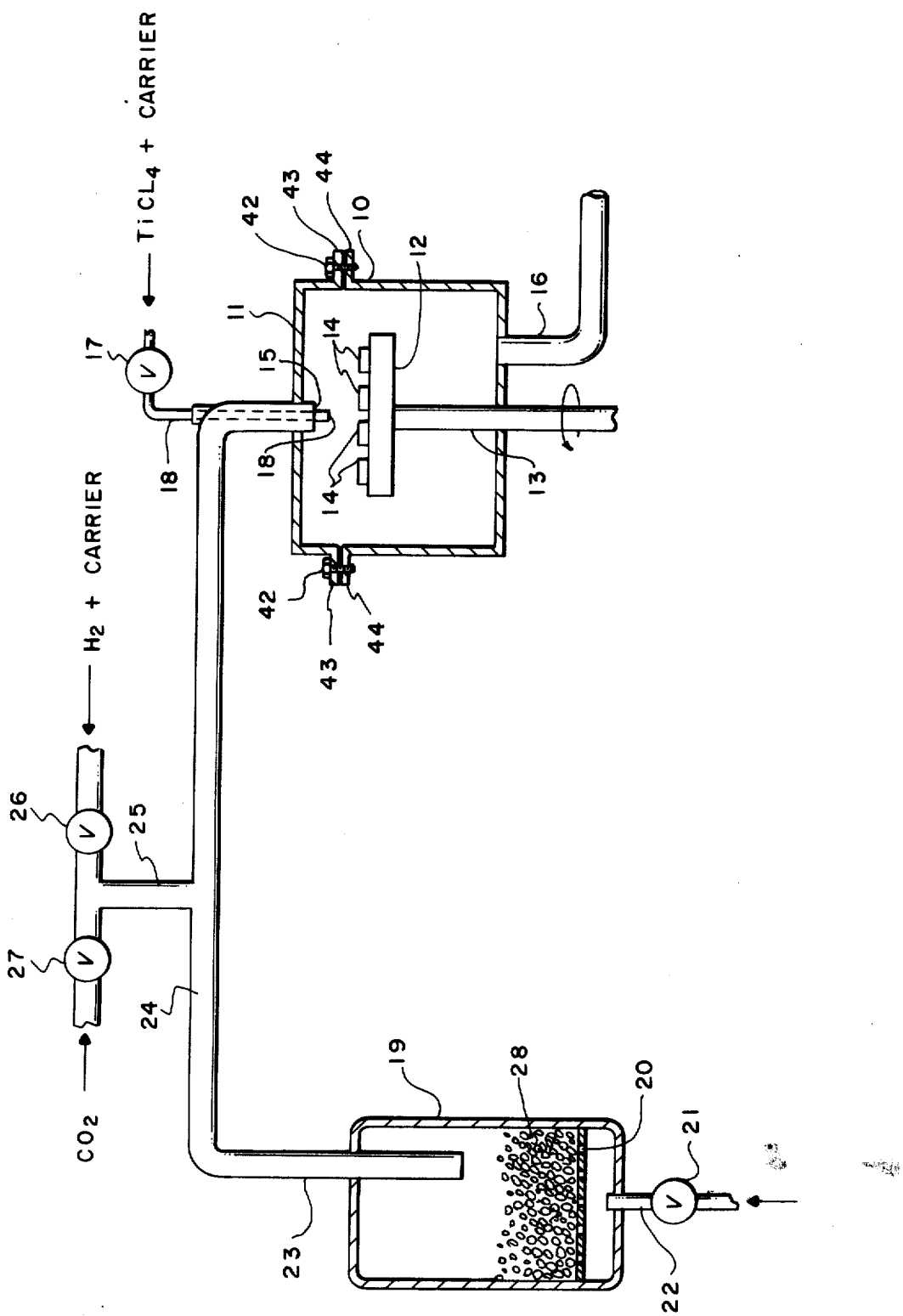

CO-DEPOSITED COATING OF ALUMINUM OXIDE AND TITANIUM OXIDE AND METHOD OF MAKING SAME

This invention relates to machine tools and wear surfaces. More particularly, it relates to coatings for wear surfaces on machine tools and the like which protect the wear surfaces from wear, abrasion, etc.; to methods for forming such coatings; and to tools having wear surfaces protected by such coatings.

Many machine parts, tools and dies and the like include wear surfaces which, in normal use, are subject to abrasion and excessive wear. To resist excessive wear such wear surfaces are conventionally made of hard materials such as hardened or treated steel or composite materials such as cemented carbides wherein a material such as tungsten carbide is dispersed in or filled with cobalt. The term 'cemented carbide' as used herein means one or more transitional carbides of a metal of Groups IV$b$, V$b$, and VI$b$ of the Periodic Table cemented or bonded by one or more matrix metals selected from the group consisting of iron, nickel and cobalt. A typical cemented carbide contains WC in a cobalt matrix or TiC in a nickel matrix. Such cemented carbides have become conventional for use in cutting tools and the like.

In more sophisticated applications extremely hard coatings of material such as titanium carbide have been applied to wear surfaces to further enhance their ability to withstand friction, abrasion and wear. U.S. Pat. No. 3,684,585 to Ralph F. Stroup, et al. discloses a method of forming a titanium carbide coating on metal or composite substrates to produce parts with extremely hard wear resistant surfaces. The use of materials such as titanium carbide, having a hardness of almost one-half that of a diamond, produces extremely hard wear surfaces and greatly enhances the useful life of machine tools and the like. Similarly, U.S. Pat. No. 3,736,107 to Thomas E. Hale discloses a cemented carbide product covered with a dense coating of aluminum oxide. These coatings, as well as others disclosed in the art, have proven quite satisfactory as wear resistant surfaces for certain applications. However, in other applications the heretofore known coatings have certain undesirable limitations. For example, titanium carbide coated work tools show excellent wear characteristics in machining materials such as cast iron at surface speeds of up to 700 surface feet per minute (SFPM). However, modern machinery will operate at even higher speeds. Furthermore, in many operations using higher speeds, feed rates are increased and roughing or interrupted cuts are employed. Under these conditions titanium carbide coated tools lose some of their effectiveness, apparently because of the tremendous amount of heat generated. When exposed to excessive heat, titanium carbide suffers from a decrease in hardness and is subject to oxidation wear.

Solid alumina ($Al_2O_3$) tools offer some advantages but are subject to other problems. For example, while alumina has very desirable high temperature wear characteristics, it is comparatively brittle. Therefore, because of fatigue and fracture failures of alumina tools, the economics of use of such tools is prohibitive in most applications. Furthermore, solid alumina tools cannot be readily fabricated to withstand the stresses to which many tools are normally subjected.

Cemented carbide tools coated with alumina, such as disclosed by U.S. Pat. No. 3,736,107 to Hale, offer some of the advantages of solid alumina tools, but because of the excessive heat generated in high speed cutting operations, the alumina coating is still subjected to wear which limits its useful life at high surface speeds.

In accordance with the invention a composite coating of titanium oxide and aluminum oxide is formed by simultaneous co-deposition of aluminum oxide and titanium oxide. The coating is formed by chemical vapor deposition and the resulting coating is adherently bonded to the work tool wear surface to form a dense adherent coating. The composite coating is preferably a matrix of aluminum oxide containing about 2% to about 8% titanium oxide. The coating exhibits a hardness of about 2400 to about 2500 on the Knoop scale.

Cemented carbide tools having a coating of the composite material exhibit substantially less wear than other coated tools, even when used at higher cutting speeds than previously attainable. Furthermore, such tools may be used for rough and interrupted cuts. The coating exhibits most of the desirable features of alumina, but also exhibits the lubricating qualities of titanium oxide. Therefore, tools coated with the composite coating of this invention have a useable lifetime many times greater than previous coated tools because the reduced friction lowers wear. Furthermore, because of the reduced friction, the heat generated in high speed operations is reduced and the cutting tools of the invention may be used at extremely high cutting speeds. Other features and advantages of the invention will become more readily understood when taken in connection with the appended claims and attached drawing in which the sole FIGURE is a schematic illustration of apparatus suitable for forming composite coatings in accordance with the invention.

The FIGURE refers to an apparatus for producing the product.

Referring now to the drawing, the apparatus illustrated comprises an enclosed vessel 10 of stainless steel or other suitable material having a removable top cover 11. The cover 11 is attached to the reaction vessel 10 by any suitable means such as bolts 42, clamps, hinges or other means for joining the flanges 43 and 44 on the cover 11 and reaction vessel 10, respectively. Since the reaction is preferably carried out at essentially atmospheric pressure, any suitable means for enclosing the vessel may, of course, be used.

The vessel 10 is provided with a top inlet 15 and a bottom outlet 16. The articles to be coated are positioned within the reactor by any conventional means. In the embodiment illustrated, cemented carbide inserts 14 are positioned on a rotatable table 12 which is rotated by shaft 13 driven by an external power source (not shown). Various other conventional means for mounting the substrates within the reaction zone, such as hooks and the like, will be readily apparent to those skilled in the art.

The reaction vessel 10 is closed and flushed with a suitable inert gas such as nitrogen, argon or the like. During the flushing operation the work pieces 14 are heated to a temperature of about 900° C to about 1250° C by conventional means such as RF heaters or resistance heaters (not shown). The reactant gases are then injected into the heated reaction zone through inlet 15 as will be explained hereinafter.

In the preferred practice of the process of the invention, alumina is formed by the reaction of an aluminum halide such as $AlCl_3$ with water vapor. The reactant gases may be provided from any suitable source. In accordance with the preferred method, however, pellets or chips 28 of aluminum are contained in a chlorinator 19 and supported on a screen or grid 20. The chlorinator 19 is heated to a temperature between about 450° C and 525° C and chlorine admitted to the bottom of the chlorinator 19 below the screen 20 via valve 21 and line 22. Aluminum chloride gas ($AlCl_3$) formed by the reaction of chlorine with the hot aluminum chips 28 exits chlorinator 19 through line 23. Alternatively, aluminum chloride may be provided in powder form and heated to form aluminum chloride gas. Any other suitable source of relatively pure aluminum chloride gas may be used.

Aluminum chloride gas (produced by any suitable method) is conducted through line 23 into mixing line 24 which communicates with inlet 15. Simultaneously, hydrogen and carbon dioxide gas ($CO_2$) are admitted to mixing tee 25 via valves 26 and 27, respectively. Mixing tee 25 and line 24 are maintained at a temperature between 370° and 410° C by conventional heating means (not shown) so that hydrogen and carbon dioxide may react immediately to form water vapor according to the reaction $$H_2 + CO_2 \rightarrow H_2O + CO \tag{1}$$

The hydrogen is preferably admitted in the form of a gas mixture comprising 50% $H_2$ and 50% inert gas such as argon. The inert gas serves as a carrier stream for the reacting products.

The reaction products and carrier stream are fed into the mixing line 24 and mixed with the aluminum chloride gas. The mixed reactant stream is then fed into the reaction 10 via mixing line 24 and inlet 15.

The water vapor and aluminum halide react in the heated reaction vessel 10 to form alpha alumina according to the alumina deposition reaction $$3H_2O + 2AlCl_3 \rightarrow Al_2O_3 + 6HCl \tag{2}$$

The co-deposit of the invention is formed by simultaneously injecting a titanium halide, such as titanium tetrachloride ($TiCl_4$), directly into the reaction zone so that $Ti_2O_3$ may be incorporated in the alumina matrix. In the preferred embodiment, a carrier gas such as argon is bubbled through a container of $TiCl_4$. The $TiCl_4$ entrained in the carrier gas is injected directly into inlet 15 via valve 17 and line 18 as illustrated in the drawing. The titanium tetrachloride reacts with the water vapor to form titanium oxide according to the reaction $$2TiCl_4 + 3H_2O + H_2 \rightarrow Ti_2O_3 + 8HCl \tag{3}$$

Thus the overall reaction occurring at the deposition surface is $$2AlCl_3 + 2TiCl_4 + 6H_2O + H_2 \rightarrow Al_2O_3 + Ti_2O_3 + 14HCl$$

As noted above, U.S. Pat. No. 3,736,107 to Hale discloses a method for depositing dense adherent coatings of aluminum oxide on cemented carbide substrates. However, so far as is known, the coating of a cemented carbide substrate with an adherent continuous layer of titanium oxide has never been accomplished. For reasons not fully understood, attempts to form an adherent coating of titanium oxide by chemical vapor deposition result in the formation of a fine non-adherent dust or powder. In fact, difficulty may be encountered in forming the composite coating disclosed herein unless case is taken to avoid mixing of the titanium halide gas with the other reaction gases until the reaction gases are injected into the deposition zone. Premature mixing of the titanium halide gas with the other reaction gases results in the formation of a non-adherent dust or powder rather than the desired coherent uniform non-porous coating. It is believed that the titanium oxide reaction tends to form $TiO_2$ rather than $Ti_2O_3$ unless reaction conditions are maintained which promote the formation of $Ti_2O_3$. By injecting $TiCl_4$ into the reactant gases only immediately above the heated surface of the substrate where the reaction forming $Al_2O_3$ occurs, the titanium oxide reaction is substantially limited to forming $Ti_2O_3$ which is readily dispersed in the $Al_2O_3$ matrix. Thus the formation of $Ti_2O_3$ is the preferred reaction.

As illustrated in the drawing, the titanium halide gas is preferably injected into the reaction zone through an inlet tube 18 positioned concentrically within the inlet 15 which injects the other reactant gases. The opening for inlet 18 is preferably coterminous with inlet 15 or projects slightly past the opening in inlet 15 as illustrated in the drawing. In this manner all the reactant gases are injected into the reaction zone at a point immediately above the work pieces 14 and are therefore heated to reaction temperature immediately upon mixing. The reaction product is a dense, non-porous, firmly adherent coating comprising a matrix of alpha alumina ($Al_2O_3$) with hexagonal alpha titanium oxide ($Ti_2O_3$) uniformly dispersed therein.

The hardness of the composite coating produced as described above has been determined to be about 2400 to about 2500 on the Knoop scale, while the theoretical hardness of $Al_2O_3$ is about 2100 on the Knoop scale. Accordingly, co-deposition of the titanium oxide with the aluminum oxide coating forms a coating which is harder than aluminum oxide alone. More importantly, the titanium oxide adds lubricating properties to the coating, thus lowering the friction between the coated tool and the work material. By reducing the friction between the work material and the cutting tool, higher cutting speeds are permitted and temperatures are somewhat reduced. Furthermore, the composite coating formed is not brittle, thus work tools coated therewith may be used for roughing and interrupted cuts without rupturing or fracturing the coating on the work tool.

The improvement in useful life of a cemented carbide cutting tool coated with the composite coating of the invention is dependent upon the concentration of titanium oxide in the composite coating. Improved cutting characteristics are observed with as little as 2% titanium oxide. The optimum concentration of titanium oxide in the coating is in the range of about 4% to about 5%. With increasing concentrations of titanium oxide in excess of about 8%, the effectiveness as a hard coating on work tools decreases. When the concentration of titanium oxide is as high as 10%, the coating formed is usually not as good as pure aluminum oxide.

Advantageous results are obtained with coatings as thin as 0.00015 inch or less. Coatings as thick as 0.00028 inch may be readily obtained without spalling under the reaction conditions described. Coating thicknesses in the range of about 0.00022 (5.6μ) may be routinely deposited and have been found most satisfactory for use on cemented carbide inserts.

In the preferred embodiment of the process of the invention using the apparatus illustrated in the drawing, aluminum chloride powder is positioned in the chlorinator 19 and heated to a temperature of about 170° C. Argon is passed through the chlorinator at a rate of about 0.18 to about 0.22 standard cubic feet per hour (SCFH), preferably at a rate of 0.20 SCFH. Alternatively, aluminum chips 28 may be positioned in the chlorinator, heated to a temperature of about 500° C and chlorine gas passed through the chlorinator at a rate of about 1.0 to about 3.0 SCFH, preferably at a rate of 1.0 SCFH. The resulting aluminum chloride gas is injected into mixing line 24 through line 23.

A 50:50 mixture of hydrogen and argon is admitted to mixing T25 through valve 26 at a rate of 8.8 SCFH and carbon dioxide gas is admitted through valve 27 at a rate of 9.6 SCFH.

The water vapor formed by equation (1) above is thus entrained in the carrier gas and injected into line 24. Mixing line 24 is maintained at a temperature of about 400° C and the gas mixture injected into reactor 10 through inlet 15.

A container of liquid titanium tetrachloride (TiCl$_4$) is maintained at room temperature and argon bubbled therethrough at a rate of 2.45 SCFH.

The TiCl$_4$ and carrier stream is injected into the reactor 10 through inlet 18 and the gas streams mixed immediately above the work pieces 14 which are maintained at a temperature of about 1000° C. Under these conditions a coating of alpha aluminum oxide containing approximately 5% hexagonal alpha titanium oxide is formed at deposition rate of 0.00030 inch per hour. The titanium oxide is uniformly dispersed in the alumina matrix and the composite coating is adherently bonded to the wear surface forming a dense, continuous, non-porous coating.

The cemented carbide work tools show little evidence of attack by the reactant gases when the deposition temperature is between about 900° C and 1250° C. Furthermore, forming the composite coating on carbide work tools under the conditions shown above causes no serious deterioration in the transverse rupture strength of the tool. Thus the coated insert may be used for roughing or interrupted cuts without undue tool rupture.

To demonstrate the improved performance of cutting tools employing the composite coating of the invention, a series of standard C-5 grade tungsten carbide inserts were coated with the composite coating using the process described above. The concentration of T$_2$O$_3$ in the coating was varied and the inserts used in the same machine under identical conditions. The results are tabulated in the following examples.

EXAMPLE I

Four sets of identical standard C-5 grade tungsten carbide inserts were coated using the process described. The concentration of Ti$_2$O$_3$ in the coating was 0%, 2%, 5% and 8%, respectively. Each set of inserts was then used in a rough cut operation on cast iron front clutch retainers. The cutting conditions were as follows:

Cutting Speed: — 520 SFPM
Feed Rate: — 0.019 inch per revolution
Depth of Cut: — 0.200 inch The performance of each set of inserts in terms of average number pieces machined per corner of insert before failure is shown in Table I.

TABLE I

| Set No. | %Al$_2$O$_3$ | %Ti$_2$O$_3$ | Total Coating Thickness | Average Pieces Per Corner |
|---|---|---|---|---|
| 1 | 100 | 0 | 0.00022" (5.6 $\mu$) | 340 |
| 2 | 98 | 2 | 0.00022" (5.6 $\mu$) | 420 |
| 3 | 95 | 5 | 0.00022" (5.6 $\mu$) | 800 |
| 4 | 92 | 8 | 0.00022" (5.6 $\mu$) | 180 |

For comparison purposes, the same insert with a 0.00022 inch coating of titanium carbide used under the same conditions averaged only 200 pieces per corner.

EXAMPLE II

Four sets of identical C-5 grade tungsten carbide inserts were coated using the process described. The concentration of Ti$_2$O$_3$ in the coating was 0%, 2%, 4% and 10%, respectively. Each set of inserts was then used in an OD turn operation on cast iron front pump supports. The operating conditions were as follows:

Cutting Speed: — 900 SFPM
Feed Rate: — 0.018 to 0.020 inch per revolution
Depth of Cut: — 0.070 to 0.080 inch The performance of each set of inserts in terms of average number of pieces machined per corner of insert before failure is shown in Table II.

TABLE II

| Set No. | %Al$_2$O$_3$ | %Ti$_2$O$_3$ | Total Coating Thickness | Average Pieces Per Corner |
|---|---|---|---|---|
| 1 | 100 | 0 | 0.00024" (6.1 $\mu$) | 50 |
| 2 | 98 | 2 | 0.00024" (6.1 $\mu$) | 39 |
| 3 | 96 | 4 | 0.00024" (6.1 $\mu$) | 104 |
| 4 | 90 | 10 | 0.00024" (6.1 $\mu$) | 20 |

EXAMPLE III

A group of standard C-5 tungsten carbide inserts was divided into two sets. The first set was coated with a 0.00022 inch coating of Al$_2$O$_3$ using the process described above but omitting the introduction of TiCl$_4$. A 0.00022 inch coating of Al$_2$O$_3$ with 4-5% Ti$_2$O$_3$ dispersed therein was deposited on the second set. Both sets of inserts were used under identical conditions in a boring operation with cast iron pieces. The operating conditions were as follows:

Cutting Speed: — 760 to 800 SFPM
Feed Rate: — 0.015 to 0.018 inch per revolution
Depth of Cut: — 0.070 to 0.090 inch Under these conditions the pure Al$_2$O$_3$ coated inserts worked an average of 150 pieces per corner. The inserts with the composite coating worked an average of 350 pieces per corner.

From the foregoing examples it is apparent that as little as 2% Ti$_2$O$_3$ dispersed in the Al$_2$O$_3$ coating may significantly increase the performance of cutting tools in some applications.

As illustrated in the above examples, inserts with the composite coating of the invention have exhibited substantially longer useable lifetimes than inserts coated with prior known coatings when used at cutting speeds presently used. However, because of the lubricating characteristics of Ti$_2$O$_3$ imparted to the composite coating by the dispersion of Ti$_2$O$_3$ therein, the cutting speeds may be dramatically increased without damaging the cutting tool. For example, cemented carbide inserts coated with the composite alumina and titanium oxide coating have been routinely used in machining operations on case iron at cutting speeds as high as 1200 SFPM with no adverse effects.

While the invention has been described in detail with reference to cemented carbide inserts, it will be readily appreciated that the invention is not so limited. Other wear surfaces which require the hardness and low friction characteristics of the coating formed may likewise be improved by co-deposition of alumina and titanium oxide thereon in accordance with the principles of the invention. It is to be understood, therefore, that although the invention has been described with particular reference to specific embodiments thereof, the forms of the invention shown and described in detail are to be taken as preferred embodiments of same, and that various changes and modifications may be resorted to without departing from the spirit and scope of the invention as defined by the appended claims.

What is claimed:

1. An article of manufacture comprising:
   a. a substrate having a wear surface, and
   b. a dense continuous composite coating of aluminum oxide and titanium oxide adherently bonded to and covering at least a portion of said wear surface.

2. The article of manufacture defined in claim 1 wherein the coating thickness is from about 0.00015 inch to about 0.00028 inch.

3. The article of manufacture defined in claim 1 wherein said substrate is a cemented carbide work tool.

4. The article of manufacture defined in claim 1 wherein said aluminum oxide is alpha alumina and said titanium oxide is hexagonal alpha titanium oxide uniformly dispersed in the alumina.

5. The article of manufacture defined in claim 1 wherein said titanium oxide comprises from about 2% to about 10% of said coating.

6. A cemented carbide work tool having a coating of alpha alumina containing from about 2% to about 10% hexagonal alpha titanium oxide dispersed therein adherently bonded to the wear surface of said work tool.

* * * * *